(12) United States Patent
Matsumura et al.

(10) Patent No.: US 7,718,254 B2
(45) Date of Patent: May 18, 2010

(54) METHOD OF FORMING PORES IN CRYSTAL SUBSTRATE, AND CRYSTAL SUBSTRATE CONTAINING PORES FORMED BY THE SAME

(75) Inventors: Michio Matsumura, Suita (JP); Kazuya Tsujino, Suita (JP)

(73) Assignee: Sharp Kabushiki Kaisha, Osaka (JP)

( * ) Notice: Subject to any disclaimer, the term of this patent is extended or adjusted under 35 U.S.C. 154(b) by 408 days.

(21) Appl. No.: 11/718,846

(22) PCT Filed: Nov. 1, 2005

(86) PCT No.: PCT/JP2005/020123

§ 371 (c)(1),
(2), (4) Date: May 8, 2007

(87) PCT Pub. No.: WO2006/051727

PCT Pub. Date: May 18, 2006

(65) Prior Publication Data

US 2008/0090074 A1      Apr. 17, 2008

(30) Foreign Application Priority Data

Nov. 9, 2004   (JP)   ............................. 2004-324879
Jun. 16, 2005  (JP)   ............................. 2005-176696

(51) Int. Cl.
  *B32B 3/26*   (2006.01)
  *B32B 5/00*   (2006.01)
(52) U.S. Cl. .............. 428/317.9; 428/307.3; 428/312.6; 428/312.8; 428/338
(58) Field of Classification Search ........................ None
See application file for complete search history.

(56) References Cited

U.S. PATENT DOCUMENTS

| | | | |
|---|---|---|---|
| 5,262,021 A | 11/1993 | Lehmann et al. | |
| 7,135,414 B2 * | 11/2006 | Matsumura et al. | ......... 438/745 |
| 2005/0101153 A1 | 5/2005 | Matsumura et al. | |

FOREIGN PATENT DOCUMENTS

| | | | |
|---|---|---|---|
| JP | 5-315316 A | 11/1993 |
| JP | 06-326077 A | 11/1994 |
| JP | 11-268281 A | 10/1999 |
| JP | 2002-237468 A | 8/2002 |
| JP | 2002-367960 A | 12/2002 |

(Continued)

OTHER PUBLICATIONS

International Search Report of PCT/JP2005/020123, date of mailing Jan. 24, 2006.

(Continued)

*Primary Examiner*—Ling Xu
(74) *Attorney, Agent, or Firm*—Westerman, Hattori, Daniels & Adrian, LLP

(57) ABSTRACT

A crystalline substrate 1 having straight or spiral deep pores is obtained in cost effective manner. A method for forming pores comprises the steps of preparing the monocrystalline substrate 1 of which (100) surface is processed to be perpendicular to the depth direction of pores to be formed, and an etchant containing 10.0% by weight or less hydrofluoric acid; and chemically etching the substrate surface with metallic particles 2 such as silver, platinum and palladium electroless-plated on it.

5 Claims, 19 Drawing Sheets

FOREIGN PATENT DOCUMENTS

| JP | 2004-095849 A | 3/2004 |
|---|---|---|
| WO | WO 02/39492 A1 | 5/2002 |
| WO | WO 03/105209 A1 | 12/2003 |

OTHER PUBLICATIONS

V. Lehmann, et al., "The limits of macropore array fabrication", *Siemens AG. Dept ZFET ME 1*, 81730 München, Germany, Thin Solid Films 297 (1997) pp. 13-17.

V. Lehmann, et al., "The Physics of Macropore Formation in Low-Doped p-Type Silicon", *Journal of The Electrochemical Society*, 146 (8) (1999), pp. 2968-2975.

Michio Matsumura, "Nano-sized deep hole on silicon substrate with silver particles as catalyst", Nikkan Kogyo Shinbun issued on Apr. 22, 2005.

Kazuya Tsujino, et al.; "Boring Deep Cylindrical Nanoholes in Silicon Using Silver Nanoparticles as a Catalyst", Advanced Materials, *Adv. Mater. 2005*, 17, No. 8, Apr. 18, pp. 1045-1047.

Kuiqing Peng, et al., "Uniform, Axial-Orientation Alignment of One-Dimensional Single-Crystal Silicon Nanostructure Arrays", *Angew. Chem. Int. Ed. 2005*, 44, pp. 2737-2742.

X. Li, et al., "Metal-assisted chemical etching in $HF/H_2O_2$ produces porous silicon", Applied Physics Letters, vol. 77, No. 16, Oct. 16, 2000, pp. 2572-2574.

* cited by examiner

METHOD OF FORMING PORES IN CRYSTAL SUBSTRATE, AND CRYSTAL SUBSTRATE CONTAINING PORES FORMED BY THE SAME

TECHNICAL FIELD

The present invention relates to monocrystalline substrates having pores with high aspect ratio or mono/multicrystalline substrates having spiral pores, and to a method for forming such pores in crystal substrates.

BACKGROUND ART

It is desired to make deep pores with high aspect ratio in a silicon substrate on manufacturing fields of a trench capacitor in a semiconductor memory (Patent Reference 1), a penetration electrode in a three-dimensional packaging (Patent Reference 2) a nozzle plate in an inkjet printer (Patent Reference 3) and so on. For methods to make such deep pores with high aspect ratio, the reactive ion etching method (Patent Reference 4) and the electrochemical etching method (Patent Reference 5, Nonpatent Reference 1, 2) are known.

In the reactive ion etching (RIE) method, a patterned hard mask is laid on a monocrystalline substrate to be etched in a plasma reaction chamber. Then, sidewall protection deposit is accumulated during etching to limit the opening width of the hard mask. Therefore, it became difficult for reactive etchant ion to reach the substrate through the size reduced opening, and a process for reducing the thickness of the side wall protection deposit is required.

In the electrochemical etching method, while a substrate is being contacted with electrolyte, positive voltage has to be externally applied to the substrate.

Patent Reference 1: Published Japanese translation of a PCT application No. 2004-514276
Patent Reference 2: Japanese Unexamined Patent Application Publication No. 2004-95849
Patent Reference 3: Japanese Unexamined Patent Application Publication No. H11-268281
Patent Reference 4: Japanese Unexamined Patent Application Publication No. 2002-367960
Patent Reference 5: Japanese Unexamined Patent Application Publication No. H6-326077
Nonpatent Reference 1: Thin Solid Films, 1997, 297, 13-17
Nonpatent Reference 2: J. Electrochem. Soc., 1999, 146, 2968-2975
Nonpatent Reference 3: Nikkan Kogyo Shinbun (issued on Apr. 22, 2005)
Nonpatent Reference 4: Adv. Mater., 2005, 17, 1045-1047
Nonpatent Reference 5: Angew. Chem. Int. Ed. 2005, 44, 2737-2742
Nonpatent Reference 6: Appl. Phys. Lett., 2000, 77, 2572-2574

DISCLOSURE OF THE INVENTION

Problem to be Solved by the Invention

In the reactive ion etching method, however, depth of pores is limited to about 20 μm due to the material deposited on the side walls during etching. Hence, in order to make deep pores, the repetition of the process for reducing the thickness of the side wall material is necessary, which costs expensive. In addition, in the electrochemical etching method, an external power source is required, and moreover, the power source has to be electrically connected with each substrate. This reduces mass productivity. Accordingly, one of the objects of the present invention is to provide a monocrystalline substrate having deep pores in cost effective manner. Another object is to provide a crystal substrate having spiral pores.

Means for Solving Problem

To solve these problems, a method of the present invention comprises the steps of preparing a crystalline substrate such as silicon, and chemically etching the substrate surface with one or more types of metallic particle selected from silver, platinum and palladium loaded thereon.

According to the present invention, metallic particles 2, which are working as a catalyst of chemical etching, oxidize and dissolve crystal as illustrated in FIG. 1. This perforates a substrate 1 and as a result the metallic particles 2 reside at the bottom. Since catalytic reactions occur on the outer surface of the metallic particle, the pores 3 grow bigger enough to have a diameter similar to that of the metallic particles inwardly to the substrate 1 as the dissolution further goes on. A liquid mixture of hydrofluoric acid and oxidizer such as hydrogen peroxide and ozone is preferred for etchant. In this case, the metallic particles work as a catalyst for reduction of the oxidizer. Positive holes or oxygen atoms generated by the reduction of the oxidant oxidize apart of crystal at which the surface is in contact with the metallic particles. The oxidized crystal dissolves into the solution due to the reaction with hydrofluoric acid. This dissolution removes the part of crystal at which the surface is in contact with the metallic particle to generate a pore.

To form straight pores with high aspect ratio, a monocrystalline substrate with a (100) plane, perpendicularly to which pores are to be formed, is prepared. Chemical etching is carried out after the metal particles are loaded on the plane surface. The growth of pores has crystal orientation dependence, and the pores grow in a <100> direction, which is perpendicular to the (100) plane. When the loaded metal particles are silver particles or palladium particles, the crystal orientation dependence is evident. The depth of pores increases with the time of etching. Therefore, pores with a diameter of 100 nm or less and with an aspect ratio of 300 or more can be formed.

A monocrystalline substrate obtained by the above method is characterized by pores formed in the <100> direction, silver particles and/or palladium particles existing at the bottom of pores, and a ratio of pore diameter to particle diameter of 1 or more and 2 or less.

Furthermore, by the use of aforementioned method for forming straight pores, since the pore diameter is almost proportional to the diameter of metallic particles, the pore diameter can be controlled by the diameter of the metal particles. A desired diameter of pores is obtained by using metal particles which have a diameter of about 40 to 90% of the diameter of pores to be formed.

When straight pores are formed, preferably the aforementioned chemical etching is carried out in a liquid mixture which contains more than drop and 10.0% by weight or less of hydrofluoric acid, and more than drop of hydrogen peroxide. This is because as the concentration of hydrofluoric acid becomes higher than this range, linearity of the pores becomes worse.

On the other hand, when spiral pores are formed, contrary to this, the concentration of hydrofluoric acid has to be made higher, so that the aforementioned chemical etching is carried out in a liquid mixture which contains 28.0% by weight or more of hydrofluoric acid and 0.5% or more of hydrogen peroxide. Either monocrystalline or multicrystalline substrate can be used.

EFFECT OF THE INVENTION

Without using external power source, pores can be formed in the substrates. The diameter, depth and shape of the pores depend on the diameter of metallic particle, concentrations of etchant compositions, and time of etching. As a result, a monocrystalline substrate having deep pores which is suitable for a trench capacitor, penetration electrode, nozzle hole and a crystalline substrate having spiral pores which can be used as a coil if conductive material is filled, are produced in cost effective manner.

BRIEF DESCRIPTION OF THE DRAWINGS

FIG. 12A shows the middle part of a spiral pore, FIG. 12B shows near the bottom of a pore, and FIG. 12C is a magnified image of the area framed by a white rectangle in FIG. 12B.

DESCRIPTION OF REFERENCE NUMERALS

Figure 1:
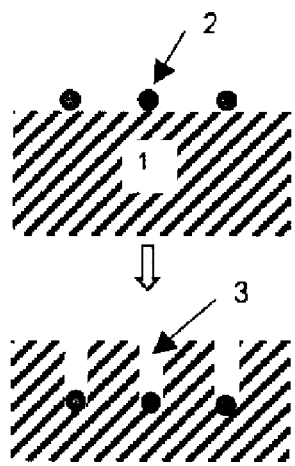
FIG. 1 is an illustration of a process for forming pores in a monocrystalline substrate using the catalytic action of silver particles.

1 Silicon substrate
2 Silver particles
3 Pores

BEST MODE FOR CARRYING OUT THE INVENTION

As a monocrystalline substrate to form straight pores in, for example, p-type or n-type monocrystalline silicon wafer having a (100) plane can be used, and in this regards, pores grow in a <100> direction, and when a monocrystalline silicon wafer having a (111) plane is used, pores grow in a direction of about 35 degrees of tilt angle against the surface.

Film deposition technologies such as high-vacuum deposition and spattering and plating technologies such as electroless plating and electroplating are used to load metallic particles on a substrate surface. The diameter of particles to be loaded depends on the deposition method and its conditions. Furthermore, the position where particles are loaded and the pattern of an area where particles are loaded can be decided by combining with a lithographic technique. Moreover, loading of particles as assembly or film enables to increase the pore diameter and to form grooves.

EXAMPLES

Example 1

A boron-doped p-type monocrystalline silicon substrate having a (100) plane and a thickness of 625 μm, which had been mirror polished, was prepared. The specific resistance was between 9.00 and 11.0 Ωcm. Separately, the following liquids were prepared.

Wash fluid: liquid mixture containing 30% of hydrogen peroxide and 96% of concentrated sulfuric acid at a volume rate of 1:4

Plating solution: aqueous solution containing 0.1 mmol/L of silver perchlorate and 1 mmol/L of sodium hydroxide Etchant: liquid mixture containing 10% of hydrofluoric acid and 30% of hydrogen peroxide at a volume rate of 10:1 (HF concentration 9.1% by weight, $H_2O_2$ concentration 2.7% by weight)

Figure 2:
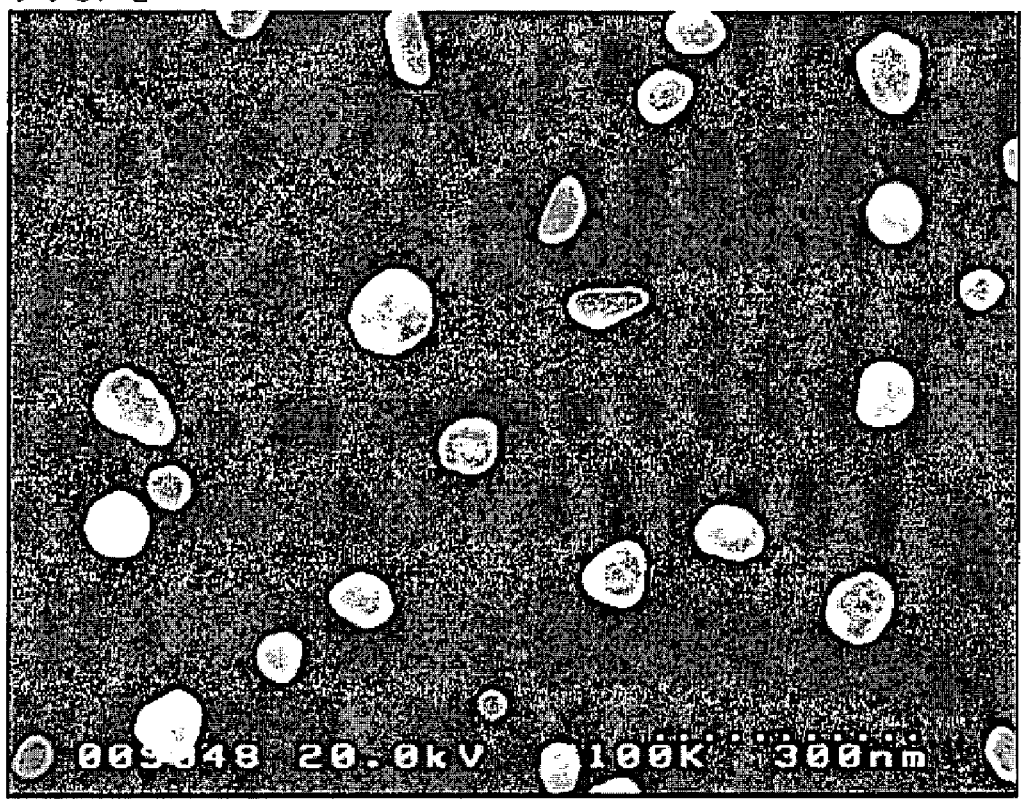
FIG. 2 is an SEM photo which shows the surface of a p-type silicon substrate having a (100) plane which was loaded with silver particles in Example 1.

The substrate was washed by soaking in the wash fluid for ten minutes and in 5% of hydrofluoric acid for five minutes to remove natural oxide. Next, the substrate was soaked in the plating solution for twenty minutes to randomly deposit silver particles on the surface. An observed image of the substrate surface with a scanning electron microscope (SEM) is shown in FIG. 2. As shown in FIG. 2, the diameter of silver particles was about 20 nm to 100 nm.

Figure 3:
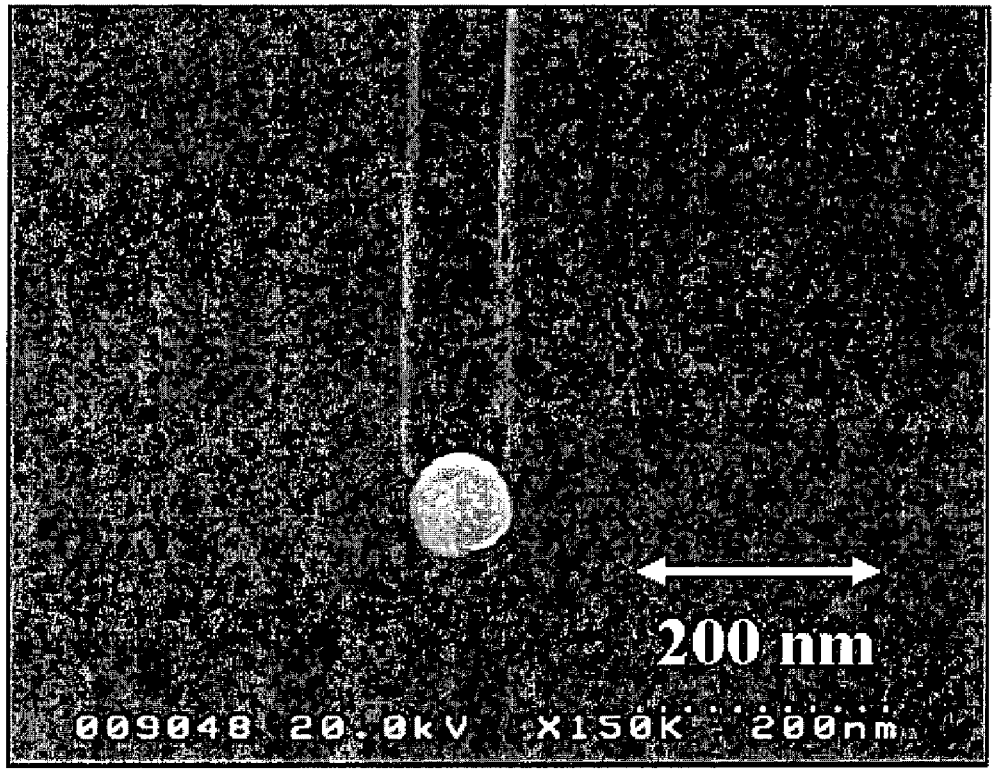
FIG. 3 is an SEM photo which shows a cross section of substrate in the thickness direction near the bottom of a pore after the chemical etching.
Figure 4:
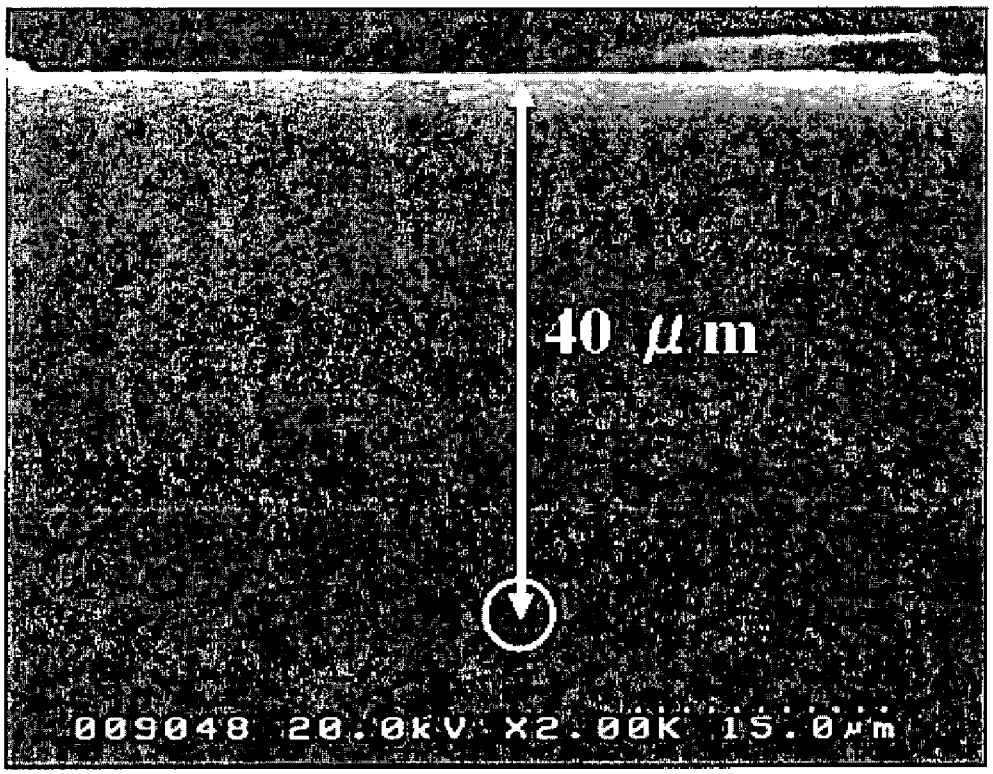
FIG. 4 is an SEM photo showing the whole of the same cross section in the thickness direction.

Then, the substrate with the silver particles was soaked in the etchant for thirty minutes. A cross sectional image of the substrate in the thickness direction observed with SEM after the etching is shown in FIG. 3. This cross sectional image shows that a pore with a diameter of about 75 nm was generated in the vertical direction from the surface, e.g., <100> direction, and a silver particle having a diameter of about 75 nm existed at the bottom of the pore. FIG. 4 is a cross sectional image of a lower magnification, in which the bottom of pores seen in FIG. 3 is indicated by a white circle. This part is positioned at about 40 μm from the surface.

Example 2

Figure 5:
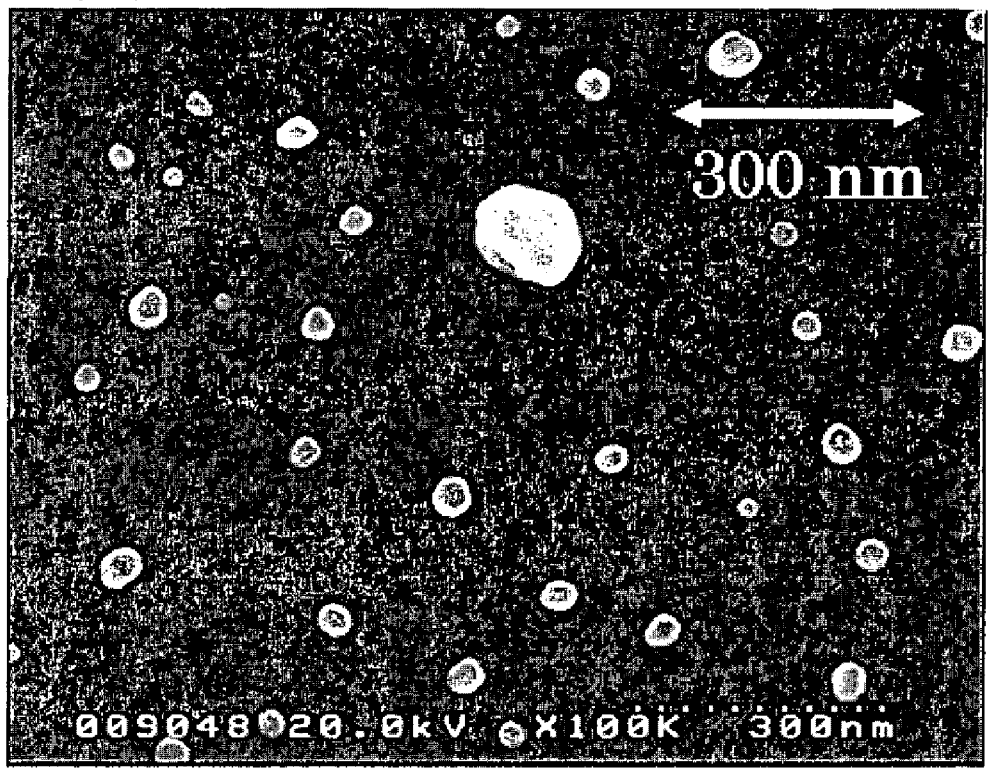
FIG. 5 is an SEM photo which shows the surface of an n-type silicon substrate with a (100) plane which was loaded with silver particles in Example 2.

A phosphorous-doped n-type monocrystalline silicon substrate having a specific resistance of between 8.00 and 12.0 Ωcm instead of the p-type monocrystalline substrate used in Example 1 was prepared. With other conditions set to the same ones as in Example 1, silver particles were loaded on the surface of the substrate. An image of the substrate surface observed with SEM is shown in FIG. 5. The diameter of silver particles was about 20 nm to 100 nm.

Figure 6:
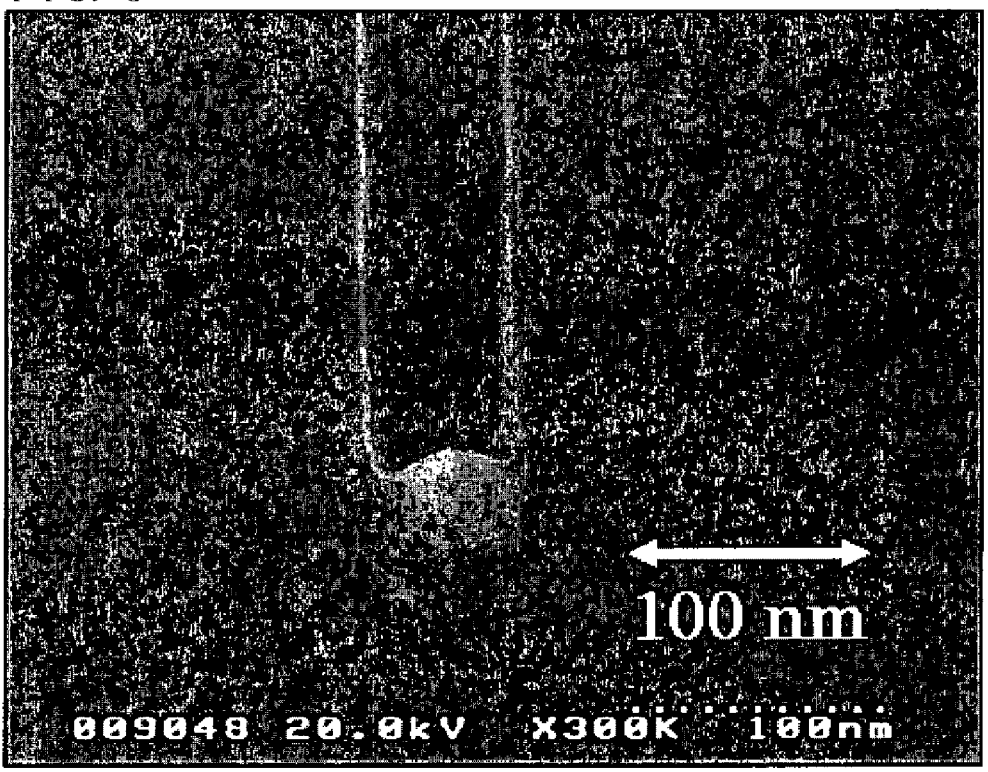
FIG. 6 is an SEM photo which shows a cross section of substrate in the thickness direction near the bottom of a pore after the chemical etching.
Figure 7:
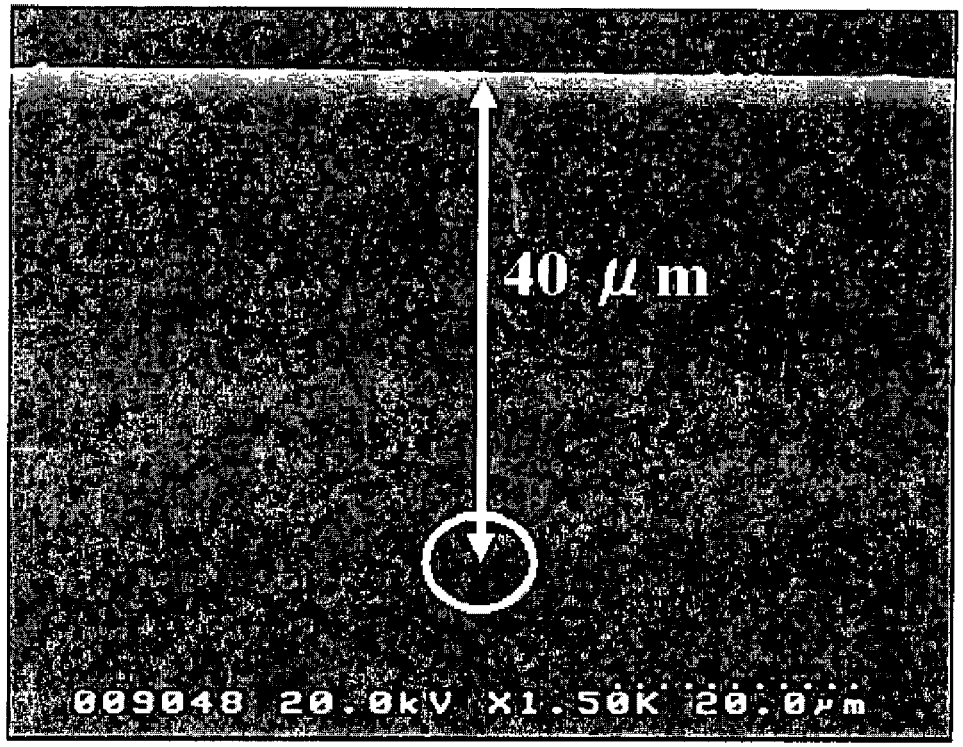
FIG. 7 is an SEM photo showing the whole of the same cross section in the thickness direction.

Then, the substrate with silver particles was soaked in the etchant for thirty minutes. An observed cross sectional SEM image of the substrate in thickness direction is shown in FIG. 6. This cross sectional image shows that pores with a diameter of about 60 nm are generated in the vertical direction from the surface, e.g., <100> direction, and silver particles having a diameter of about 50 nm exist at the bottom of the pores. FIG. 7 is a cross sectional image of lower magnification, in which the bottom of a pore seen in FIG. 6 is indicated by a white circle. This part is positioned at about 40 μm from the surface.

Example 3

Silver particles were loaded on a p-type monocrystalline silicon substrate under the same condition as in Example 1. The etching was carried out under the same condition as in Example 1 except that the soaking time in the etchant was changed to 10 hours. The deepest pore formed was 480 μm.

Example 4

Figure 8:
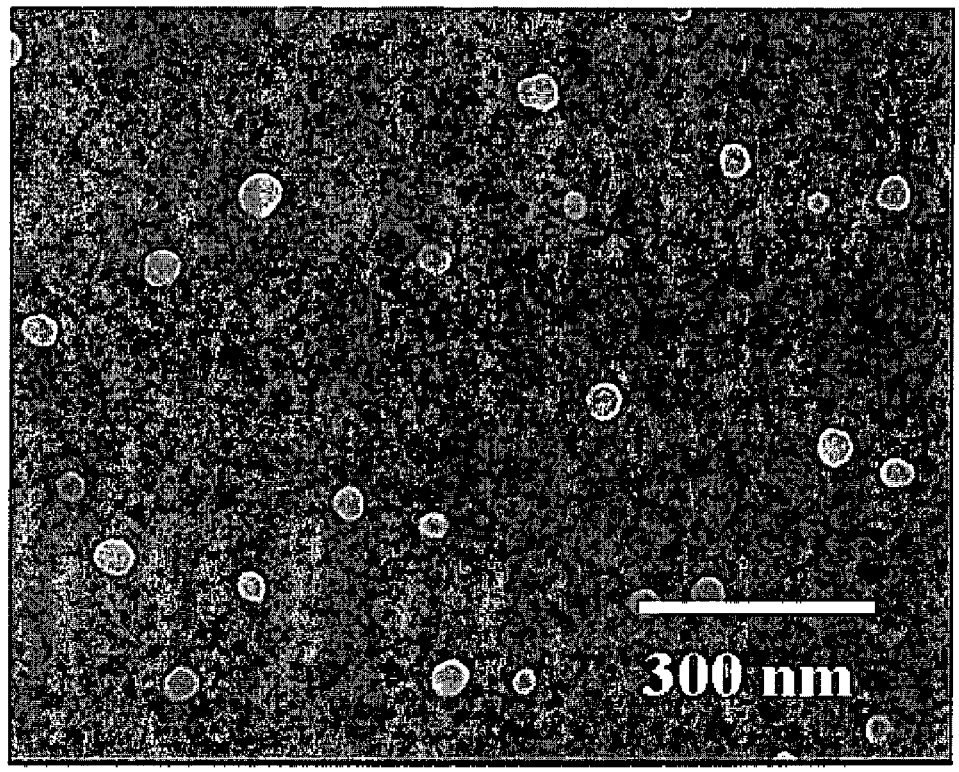
FIG. 8 is an SEM photo which shows the surface of a p-type silicon substrate with a (111) plane which was loaded with silver particles in Example 4.

A boron-doped p-type monocrystalline silicon substrate having a (111) plane and a thickness of 725 μm, which had been mirror polished, was prepared. The specific resistance was 1.0 to 2.0 Ωcm. The substrate was washed by soaking in the wash fluid prepared in Example 1 for ten minutes and then in 5% hydrofluoric acid for five minutes to remove natural oxide. Next, the substrate was soaked in the plating solution for twenty minutes to randomly deposit silver particles on the surface. An image of the substrate surface observed with a scanning electron microscope (SEM) is shown in FIG. 8. The diameter of silver particles was about 20 nm to 100 nm.

Figure 9:
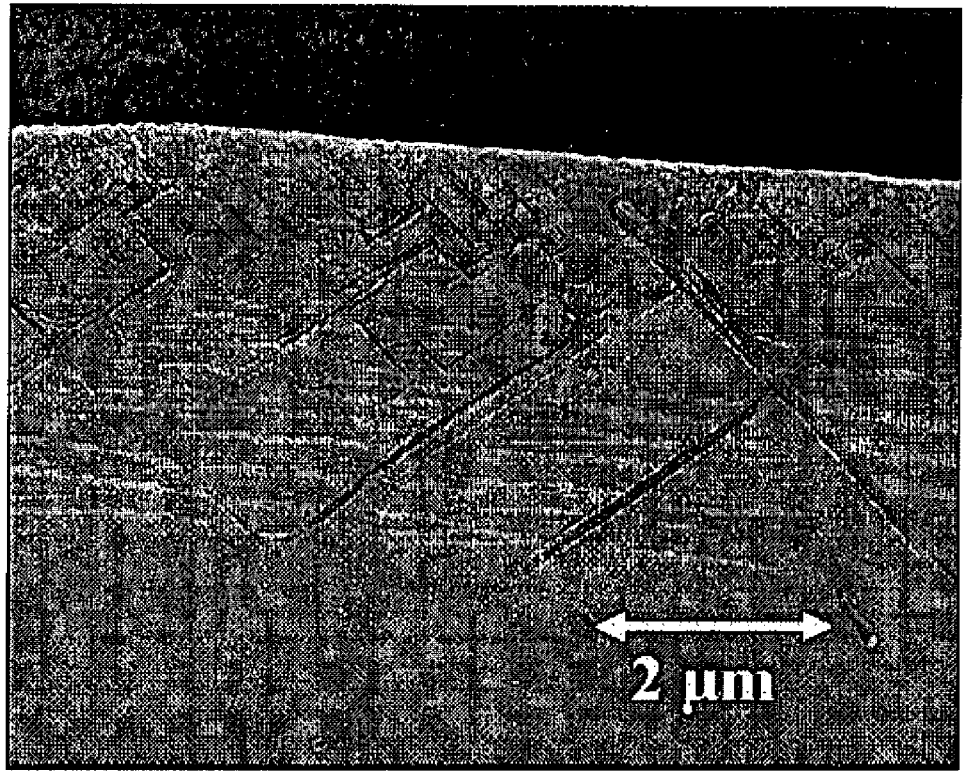
FIG. 9 is an SEM photo which shows a cross section of substrate in the thickness direction near the bottom of a pore after the chemical etching.
Figure 10:
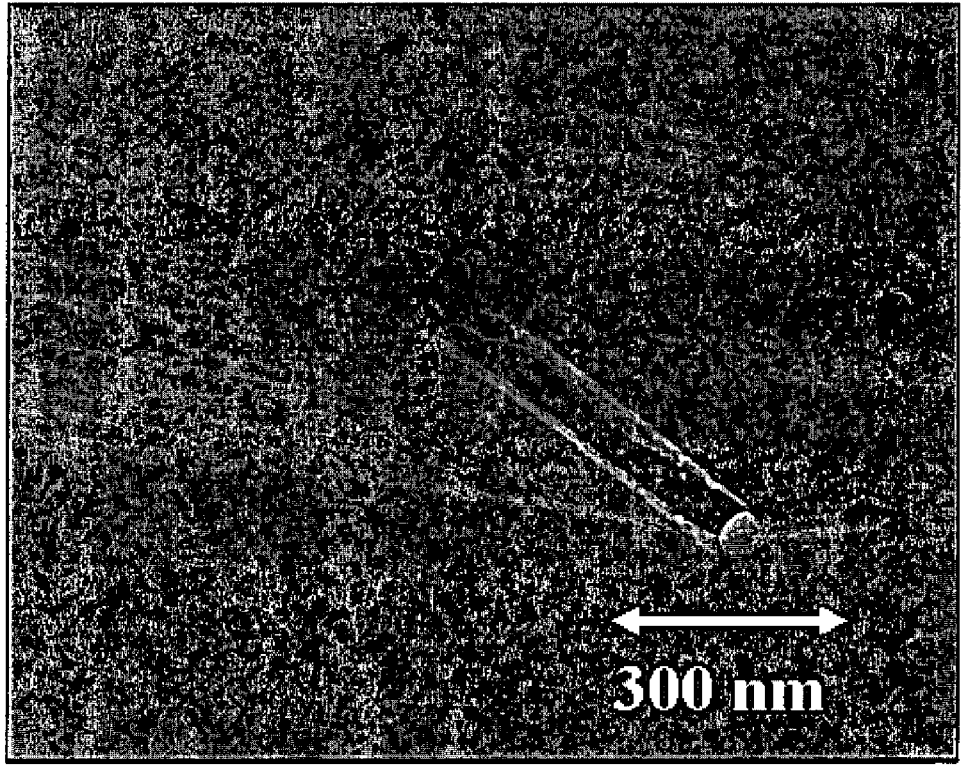
FIG. 10 is an SEM photo showing the same cross section of near the bottom of pores.

Then, the substrate with silver particles was soaked in the etchant for thirty minutes. An observed cross sectional SEM image of the substrate in thickness direction is shown in FIG. 9. This cross sectional image shows that pores were generated in the 35-degrees inclined direction from the surface, e.g., <100> direction. FIG. 10 is a magnified image of the bottom of pores, which shows that the diameter of the pore is about 70 nm and that a silver particle having a diameter of approximately 50 nm exists at the bottom of the pore.

Example 5

A boron-doped p-type monocrystalline silicon substrate having a (100) plane and a thickness of 625 μm, which had been mirror polished, was prepared. The specific resistance was 9.00 to 11.0 Ωcm. Separately, the following liquids were prepared.

Wash fluid: The same as Example 1
Plating solution: aqueous solution containing 1 mmol/L platinic chloride and 15 mmol/L of hydrofluoric acid.
Etchant: liquid mixture containing 50% hydrofluoric acid and 30% hydrogen peroxide at a volume rate of 10:1 (HF concentration 45.5% by weight, $H_2O_2$ concentration 2.7% by weight)

Figure 11:
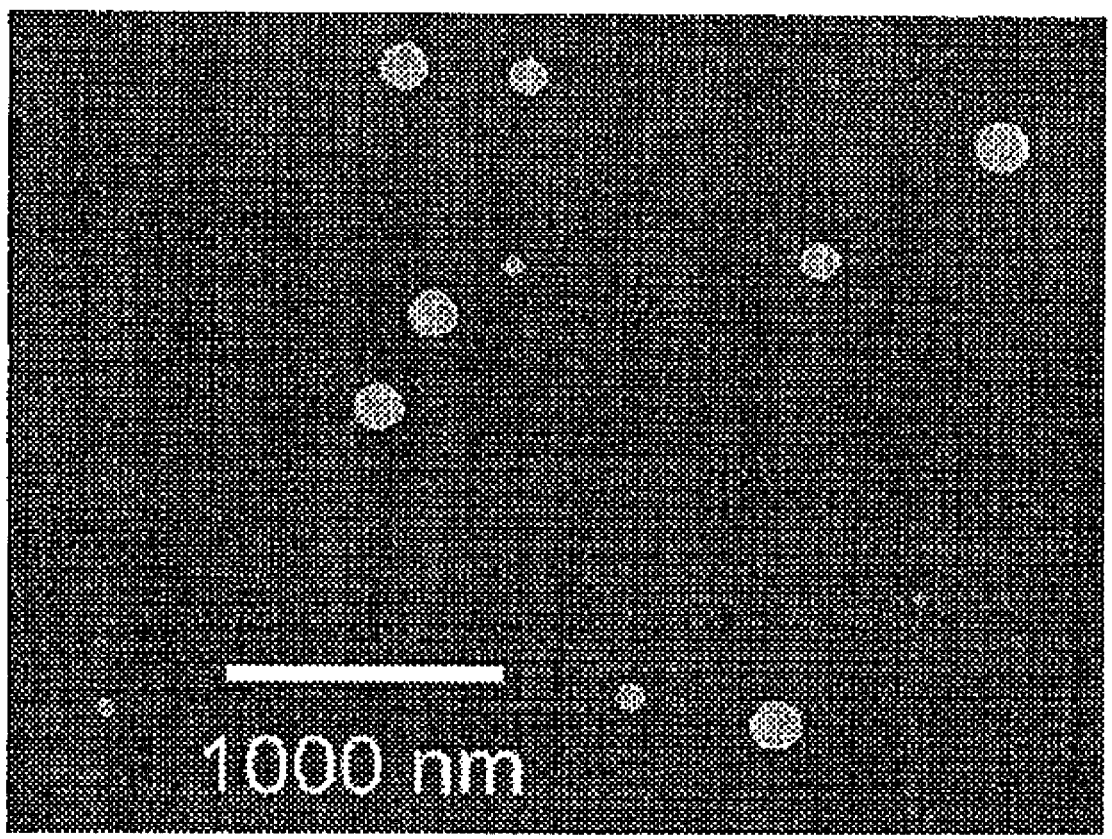
FIG. 11 is an SEM photo which shows the surface of a p-type silicon substrate with a (100) plane which was loaded with platinum particles in Example 5.

The substrate was soaked in the wash fluid for ten minutes, in ultra-pure water for ten minutes, and then in 5% hydrofluoric acid for one minute to remove natural oxide. Next, the substrate was soaked in ultra-pure water for ten minutes and in the plating solution for two minutes to randomly deposit platinum particles on the surface. The substrate with platinum particles was washed with ultra-pure water for two minutes, soaked in ethanol for three minutes and in pentane for three minutes, and then was naturally dried. An observed SEM image of the substrate surface is shown in FIG. 11. As shown in FIG. 11, the diameter of platinum particles was about 50 nm to 200 nm.

Figure 12:
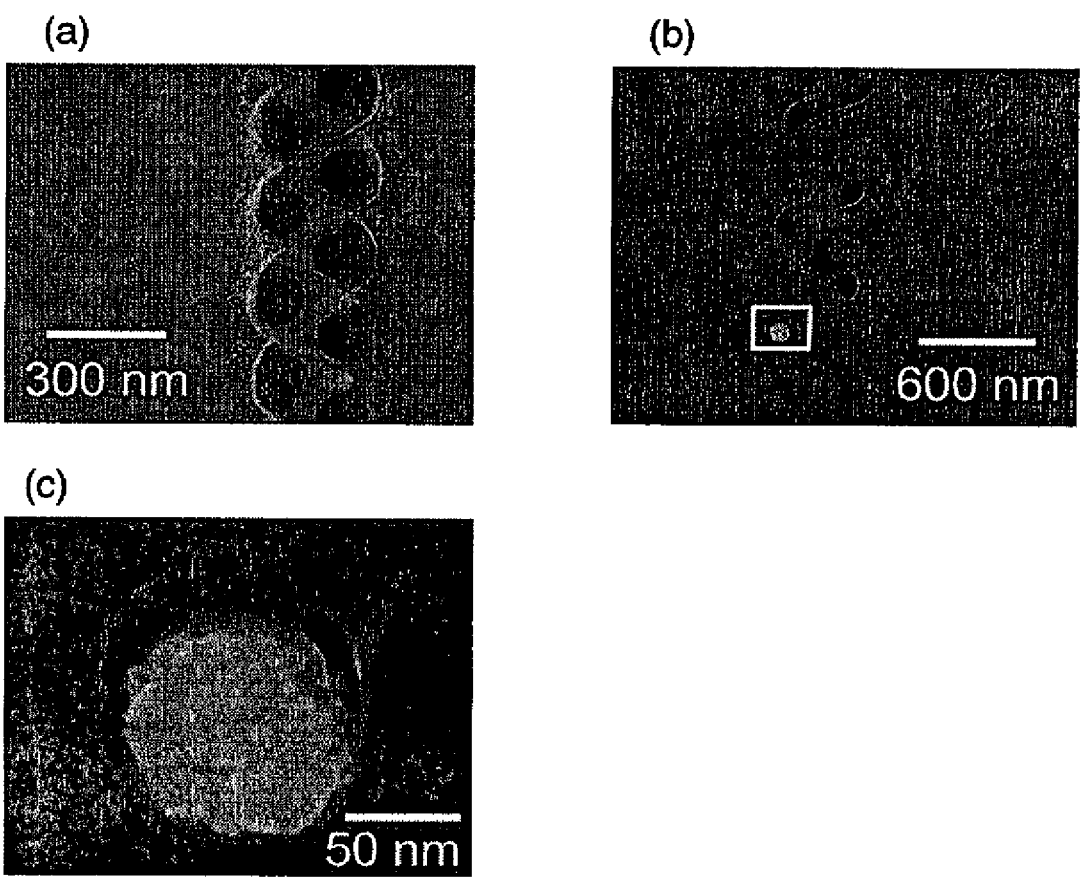
FIG. 12A-C are SEM photos which show cross sections of substrate in the thickness direction after the chemical etching.

Next, the substrate was soaked in ultra-pure water for two minutes, and was soaked in the etchant for five minutes. After the substrate was soaked in ultra-pure water, ethanol and pentane in a manner similar to the above process, it was cut in the thickness direction. The observation of the cross section with SEM showed that a lot of spiral pores exist from surface to inside, and there were platinum particles having the diameter of about 100 nm at the bottom of the pores. The shallowest pore was about 15 μm, and the deepest one was about 25 μm. The SEM images are shown in FIG. 12A-C. FIG. 12 A shows the middle part of a spiral pore, FIG. 12 B shows near the bottom of the spiral pore, and FIG. 12 C shows a magnified image of the bottom which is about 25 μm from the substrate surface. The direction of spiral axis varied depending on pore, and pitch also varied in a wide range from about 100 nm to 2000 nm depending on pore.

Examples 6 to 9

Figure 13:
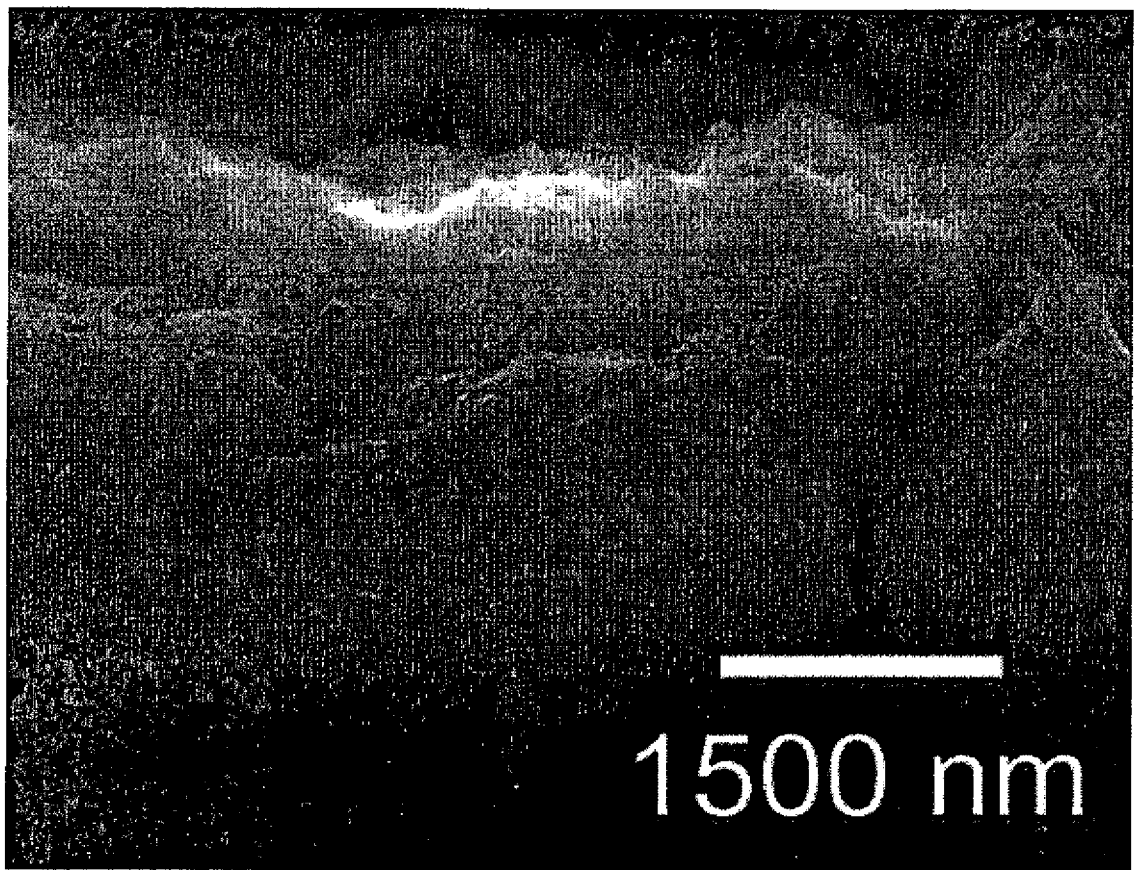
FIG. 13 is an SEM photo which shows a cross section of substrate in the thickness direction after the chemical etching in Example 9.

Platinum particles were loaded on a substrate surface under the same condition as in Example 5. Except that the concentration of hydrofluoric acid in the etchant, which was a mixture with 30% hydrogen peroxide, was changed from 50% by weight to the value shown in Table 1, the chemical etching was carried out under the same condition as in Example 5. Then, similarly to Example 5, the substrate was soaked in ultra-pure water, ethanol and pentane, was naturally dried, and then cut in the thickness direction. The observation of the cross section with SEM showed that a lot of spiral pores were formed in the substrate in Example 6. In Examples 7 and 8, straight or curved pores, which had no regularity of direction, were formed. As shown in FIG. 13, in Example 9, an about 3-μm-thick film containing a lot of pores having a diameter of several nm was formed at the surface.

TABLE 1

| Example No. | HF conc. prior to mixing (wt %) | HF conc. in etchant (wt %) |
|---|---|---|
| 6 | 40 | 36.4 |
| 7 | 30 | 27.3 |

TABLE 1-continued

| Example No. | HF conc. prior to mixing (wt %) | HF conc. in etchant (wt %) |
|---|---|---|
| 8 | 20 | 18.2 |
| 9 | 10 | 9.1 |

Examples 10 to 14

A phosphorous-doped n-type monocrystalline silicon substrate having a specific resistance between 8.00 and 12.0 Ωcm was used instead of the boron-doped p-type monocrystalline substrate used in Examples 5 to 9. With other conditions set to the same ones as in Examples 5, 6, 7, 8 and 9, Examples 10, 11, 12, 13 and 14 were carried out respectively. The observation of the cross section of the substrate with SEM showed that spiral pores were formed in Examples 10 and 11. In Examples 12 and 13, straight or curved pores having no regularity of direction were formed. In Example 14, a film containing a lot of pores was formed similarly to Example 9.

Example 15

A boron-doped p-type monocrystalline silicon substrate having a (100) plane and a thickness of 625 μm was used, which had been mirror polished, was prepared. The specific resistance was 9.00 to 11.0 Ωcm. Separately, the following liquids were prepared.

Wash fluid: The same as Example 1
Plating solution: The same as Example 1
Etchant: liquid mixture containing 50% hydrofluoric acid and 30% hydrogen peroxide at a volume rate of 10:1 (HF concentration 45.5% by weight, $H_2O_2$ concentration 2.7% by weight)

The substrate was soaked in the wash fluid for ten minutes, in ultra-pure water for ten minutes, and in 1% hydrofluoric acid for one minute to remove natural oxide. Next, the substrate was soaked in ultra pure water for ten minutes, in the plating solution for twenty minutes to randomly deposit silver particles on it. The substrate with silver particles was washed with ultra-pure water for two minutes, was soaked in ethanol for three minutes and in pentane for three minutes, and then was naturally dried.

Figure 14:
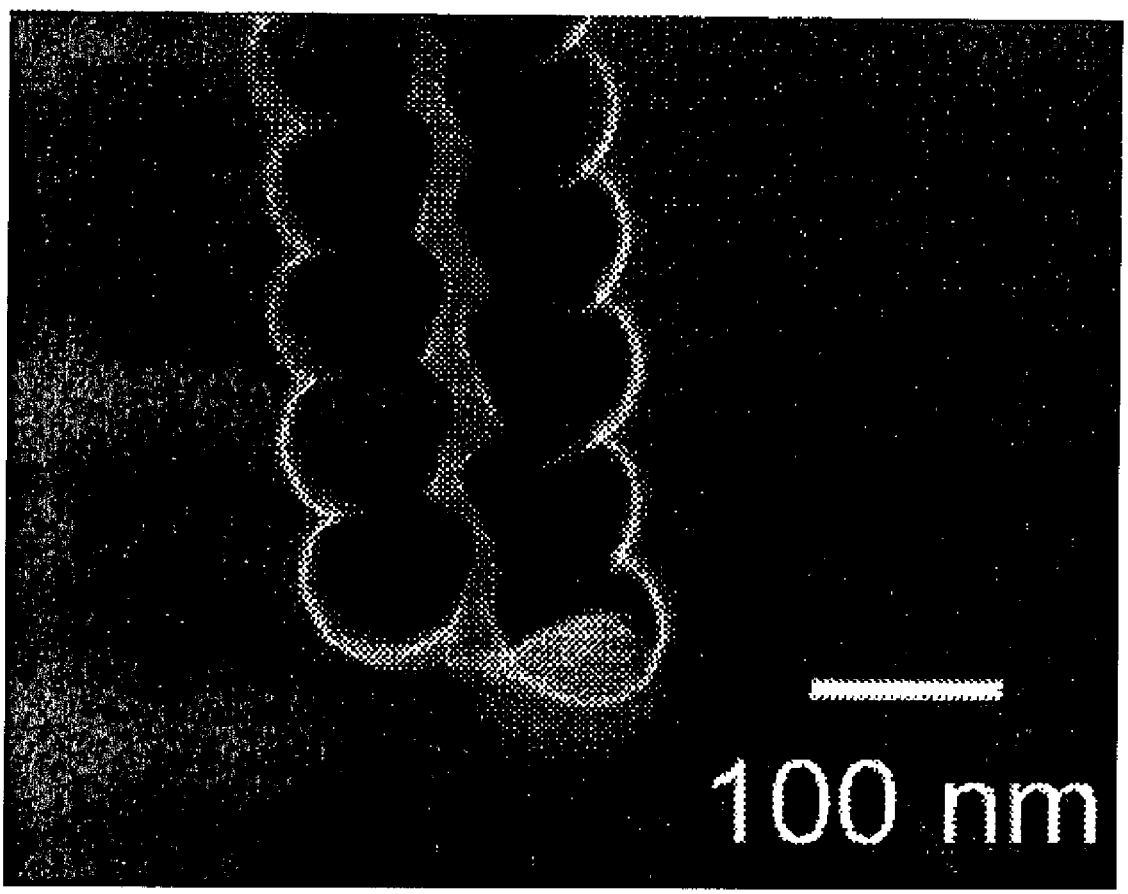
FIG. 14 is an SEM photo which shows across section of substrate in the thickness direction after the chemical etching in Example 15.

Next, the substrate was soaked in ultra-pure water for two minutes, and then was soaked in the etchant for five minutes. After being soaked in ultra-pure water for three minutes, in ethanol for three minutes and in pentane for three minutes, and naturally dried, the substrate was cut in thickness direction. The observation of the cross section of the substrate with SEM showed that a lot of spiral pores were formed from surface toward inside up to a depth of 4 μm, and that silver particles existed at the bottom of pores. FIG. 14 shows an SEM image of a pore. The direction of spiral axis varied depending on pore, and pitch also varied in a wide range from about 50 nm to 1000 nm depending on pore.

Examples 16 to 18

Silver particles were loaded on a substrate surface under the same condition as in Example 15. Except that the concentration of hydrofluoric acid in the etchant, which was a mixture with 30% hydrogen peroxide, was changed from 50% by weight to the values shown in Table 2, the chemical etching was carried out under the same condition as in Example 15. Then, similarly to Example 15, the substrate was soaked in ultra-pure water, ethanol and pentane, naturally dried, and then was cut in the thickness direction. The observation of the cross section with SEM showed that a lot of spiral pores were formed in Example 16. In Examples 17 and 18, straight pores were formed and there were some curved pores in the middle.

TABLE 2

| Example No. | HF conc. prior to mixing (wt %) | HF conc. in etchant (wt %) |
|---|---|---|
| 16 | 40 | 36.4 |
| 17 | 30 | 27.3 |
| 18 | 20 | 18.2 |

Examples 19 to 22

A phosphorous-doped n-type monocrystalline silicon substrate having a specific resistance of between 8.00 and 12.0 Ωcm was used instead of the boron-doped p-type monocrystalline substrate used in Examples 15 to 18. With other conditions set to the same as in Examples 15, 16, 17, and 18, Examples 19, 20, 21, and 22 were carried out respectively. An image of the cross section of the substrate observed with SEM showed that spiral pores were formed in Examples 19 and 20. In Examples 21 and 22, straight pores were formed and there were some curved pores in the middle.

Table 3 summarizes the results of Examples 5 to 14, which were carried out for two kinds of substrates using etchants with different HF concentrations.

Table 4 summarizes the results of Examples 1, 2, 15 to 22, which were carried out for two kinds of substrates using etchants with different HF concentrations.

TABLE 3

| HF conc. | P-type (boron-doped) | n-type (phosphorous-doped) |
|---|---|---|
| 46.5% | Example 5: spiral | Example 10: spiral |
| 36.4% | Example 6: spiral | Example 11: spiral |
| 27.3% | Example 7: straight & curved with uneven direction | Example 12: straight & curved with uneven direction |
| 18.2% | Example 8: straight & curved with uneven direction | Example 13: straight & curved with uneven direction |
| 9.1% | Example 9: porous film | Example 14: porous film |

TABLE 4

| HF conc. | P-type (boron-doped) | n-type (phosphorous-doped) |
|---|---|---|
| 46.5% | Example 15: spiral | Example 19: spiral |
| 36.4% | Example 16: spiral | Example 20: spiral |
| 27.3% | Example 17: straight & partially curved | Example 21: straight & partially curved |
| 18.2% | Example 18: straight & partially curved | Example 22: straight & partially curved |
| 9.1% | Example 1: straight (<100>direction) | Example 2: straight (<100>direction) |

Example 23

Figure 15:
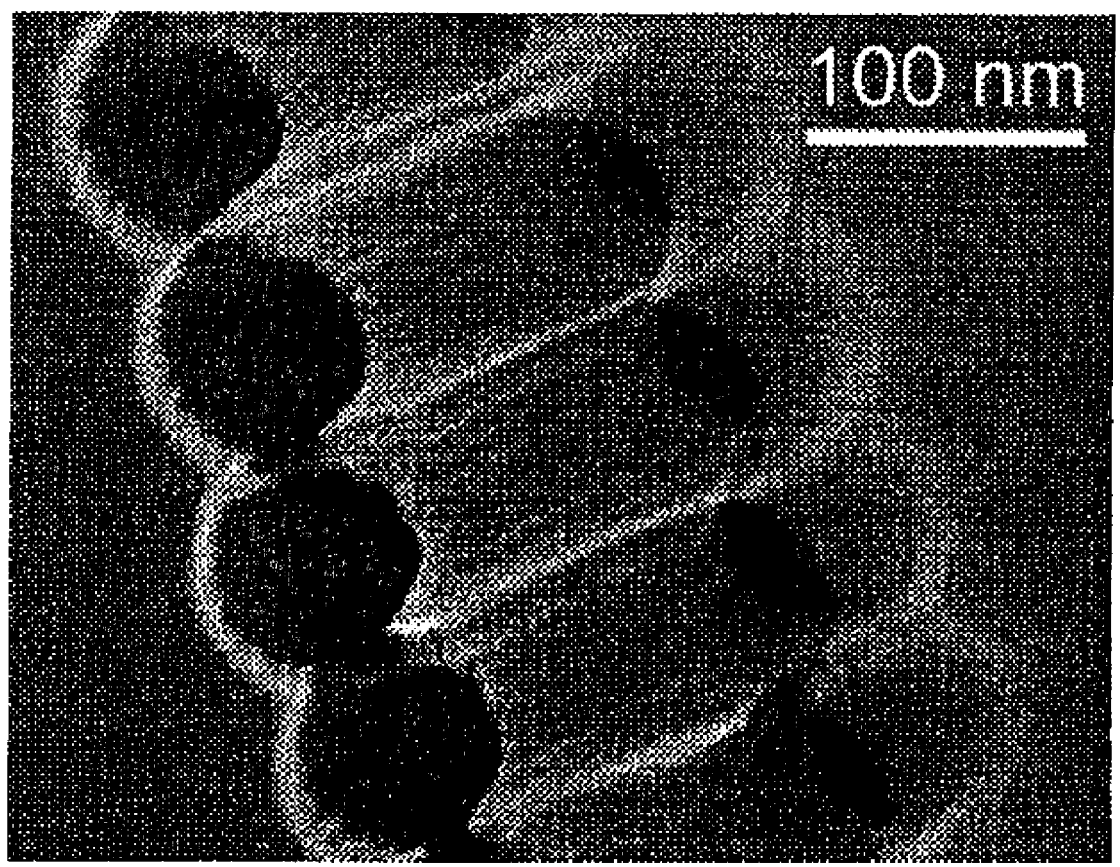
FIG. 15 is an SEM photo which shows a cross section of substrate in the thickness direction after the chemical etching in Example

Platinum particles were loaded on a substrate surface under the same condition as in Example 5. Except that the concentration of hydrofluoric acid in etchant, which was a mixture with 50% hydrogen peroxide, was changed from 30% by weight to 6% by weight (that is, $H_2O_2$ concentration in the liquid mixture=0.54% by weight), the chemical etching was carried out under the same condition as in Example 5. Then, similarly to Example 5, the substrate was soaked in ultra-pure water, ethanol and pentane, naturally dried, and then was cut in the thickness direction. An image of the cross section observed with SEM showed that a lot of spiral pores were formed as shown in FIG. 15. The deepest pore was about 8 µm.

Example 24

Figure 16:
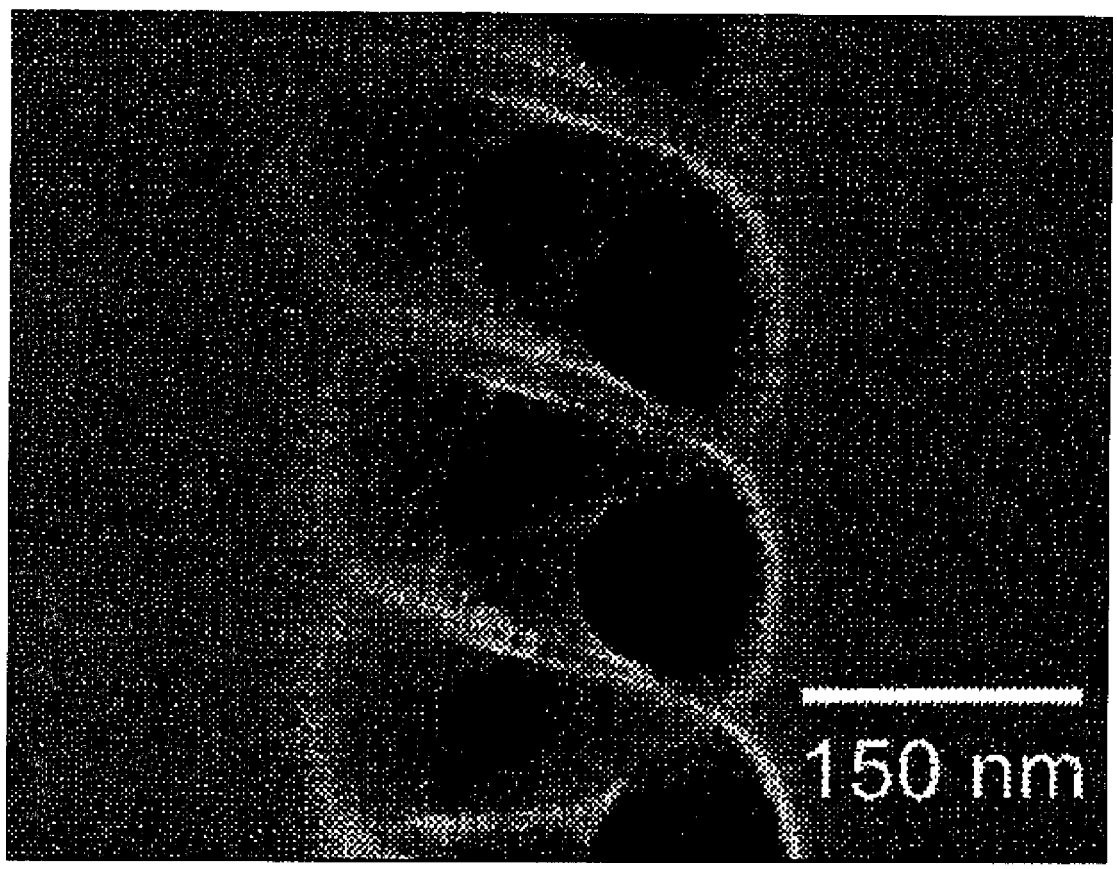
FIG. 16 is an SEM photo which shows a cross section of substrate in the thickness direction after the chemical etching in Example 24.

A phosphorous-doped n-type monocrystalline silicon substrate having a specific resistance between 8.00 and 12.0 Ωcm was used instead of the boron-doped p-type monocrystalline substrate used in Example 23. With other conditions set to the same as in Example 23, this Example was carried out. An image of the cross section of the substrate observed with SEM showed that a lot of spiral pores were formed as shown in FIG. 16. The deepest pore was about 8 µm.

Example 25

A boron-doped p-type monocrystalline silicon substrate having a (100) plane and a thickness of 625 µm, which had been mirror polished, was prepared. The specific resistance was 9.00 to 11.0 Ωcm. Separately, the following liquids were prepared.
Wash fluid: Same as Example 1
Plating solution: aqueous solution containing 0.25 mmol/L palladium chloride, 0.014 mol/L hydrochloric acid, 0.26 mol/L ammonium, 0.61 mol/L hydrofluoric acid
Etchant: liquid mixture containing 50% hydrofluoric acid, 30% hydrogen peroxide, and ultra-pure water at a volume rate of 2:1:8 (HF concentration 9.1% by weight, $H_2O_2$ concentration 2.7% by weight)

Figure 17:
FIG. 17 is an SEM photo which shows the surface of a p-type silicon substrate with a (100) plane which was loaded with palladium particles in Example 25.

The substrate was washed by soaking in the wash fluid for ten minutes, in ultra-pure water for ten minutes, in 1% hydrofluoric acid for one minute to remove natural oxide, and in ultra-pure water for ten minutes. Next, by soaking the substrate in the plating solution for two minutes, palladium particles were randomly deposited on the surface. The substrate with palladium particles was washed with ultra-pure water for two minutes, was soaked in ethanol for three minute, in pentane for three minutes, and then was naturally dried. An image of the substrate surface observed with SEM is shown in FIG. 17. Particles observed were secondary particles with a size of about 50 to 200 nm, which were made of primary particles with a size of about 30 nm.

Figure 18:
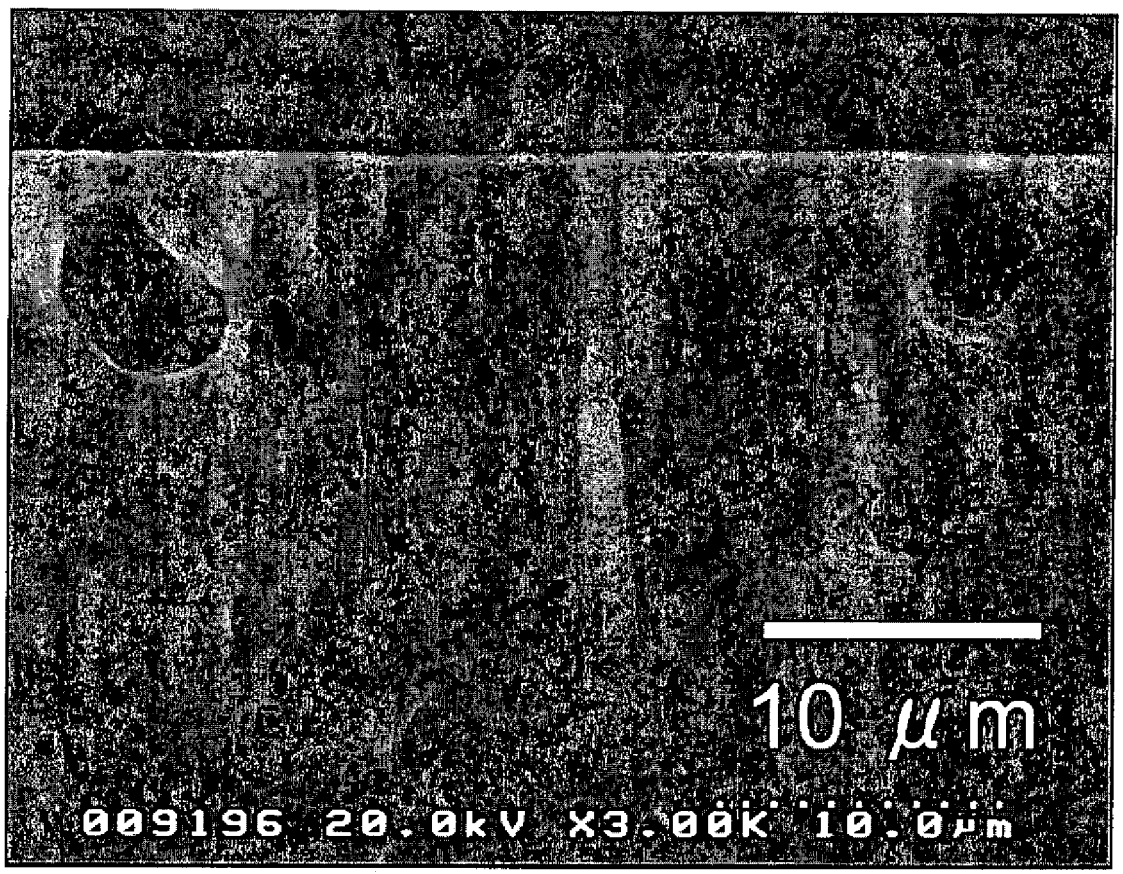
FIG. 18 is an SEM photo which shows a cross section of substrate in the thickness direction after the chemical etching.
Figure 19:
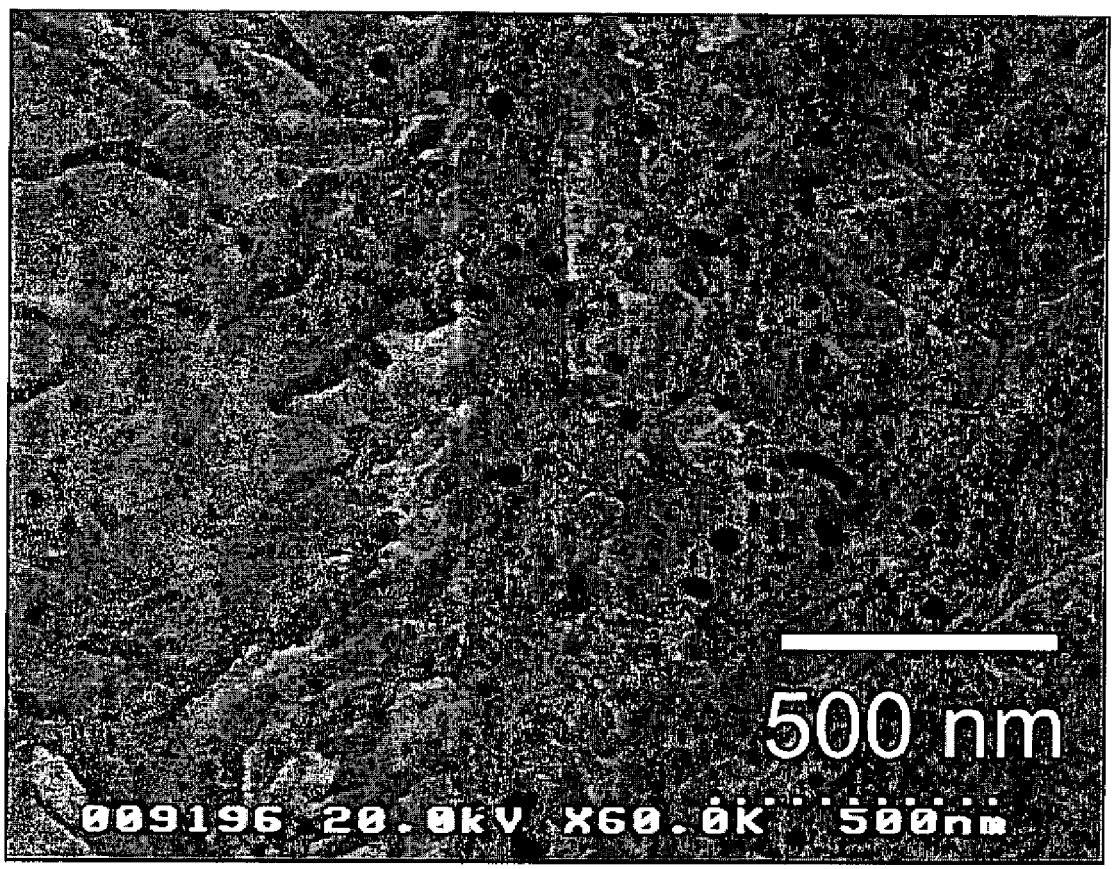
FIG. 19 is an SEM photo showing the middle point of a pore formed in the substrate.
Figure 20:
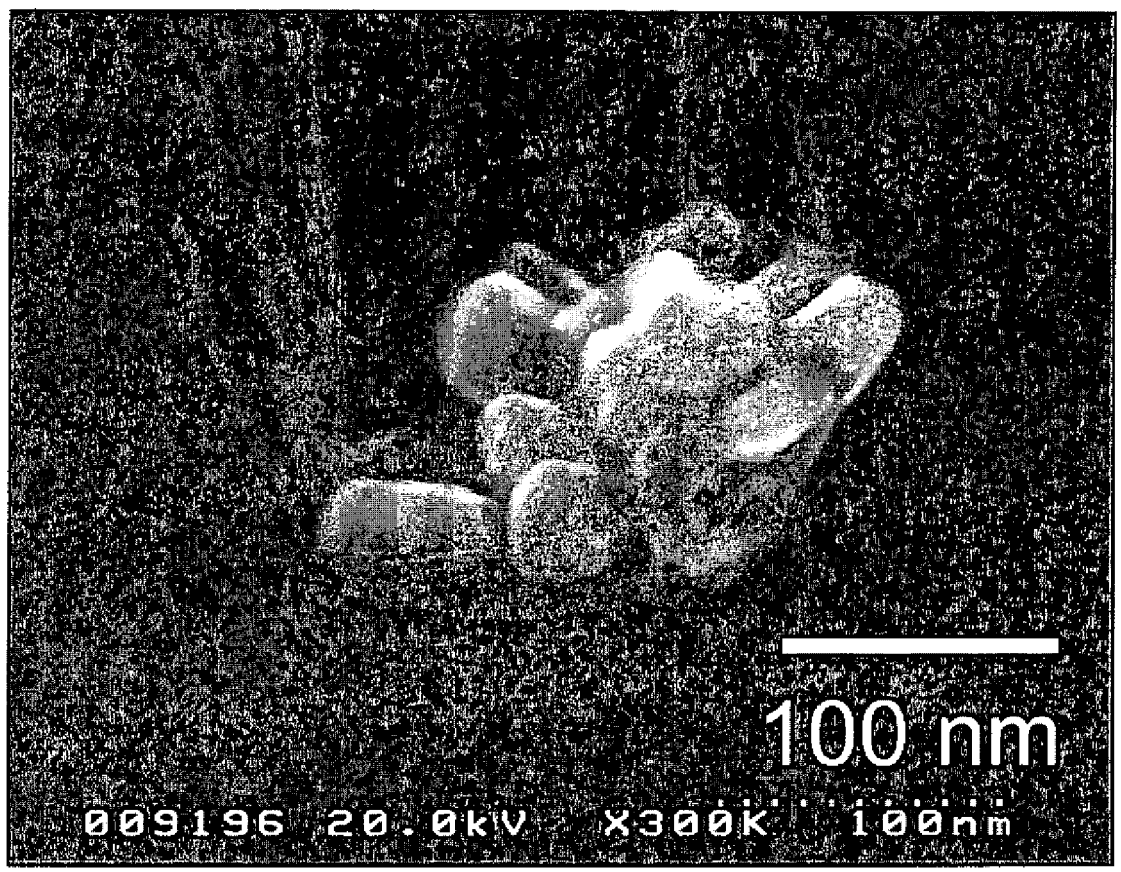
FIG. 20 is an SEM photo showing a magnified image near the bottom of a pore formed in the substrate.

The substrate loaded with palladium particles was soaked in the etchant for thirty minutes. Then, after being washed by soaking in ultra-pure water for two minutes, in ethanol for three minutes and in pentane for three minutes, and naturally dried, the substrate was cut to observe its cross section with SEM. As shown in FIG. 18, pores were preferentially formed in the direction vertical to the substrate surface, that is <100> direction. Additionally, under an increased magnification, micro-pores having a diameter of about one fifth of the pore diameter were observed, which were branched from the sidewall of the pore (FIG. 19). Furthermore, at the bottom of the pore (about 50 µm deep), particles which were probably palladium were seen as shown in FIG. 20.

Example 26

The following liquids were prepared.
Plating solution: aqueous solution of 0.25 wt % hydrofluoric acid containing 5.9 mmol/L silver nitrate
Etchant: liquid mixture containing 50% hydrofluoric acid, 30% hydrogen peroxide and ultra-pure water at a volume rate of 10:1:44

Figure 21:
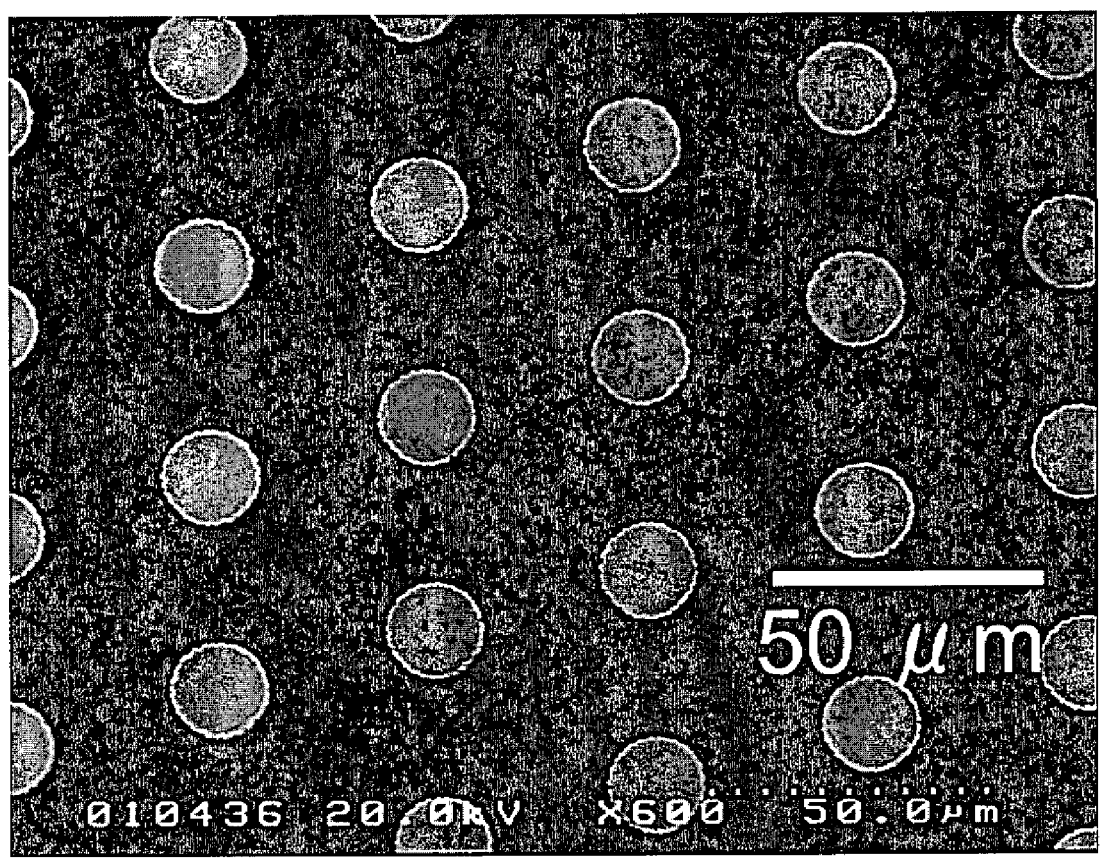
FIG. 21 is an SEM photo which shows the surface of a p-type silicon substrate with a (100) plane which was loaded with silver particles in Example 26.
Figure 22:
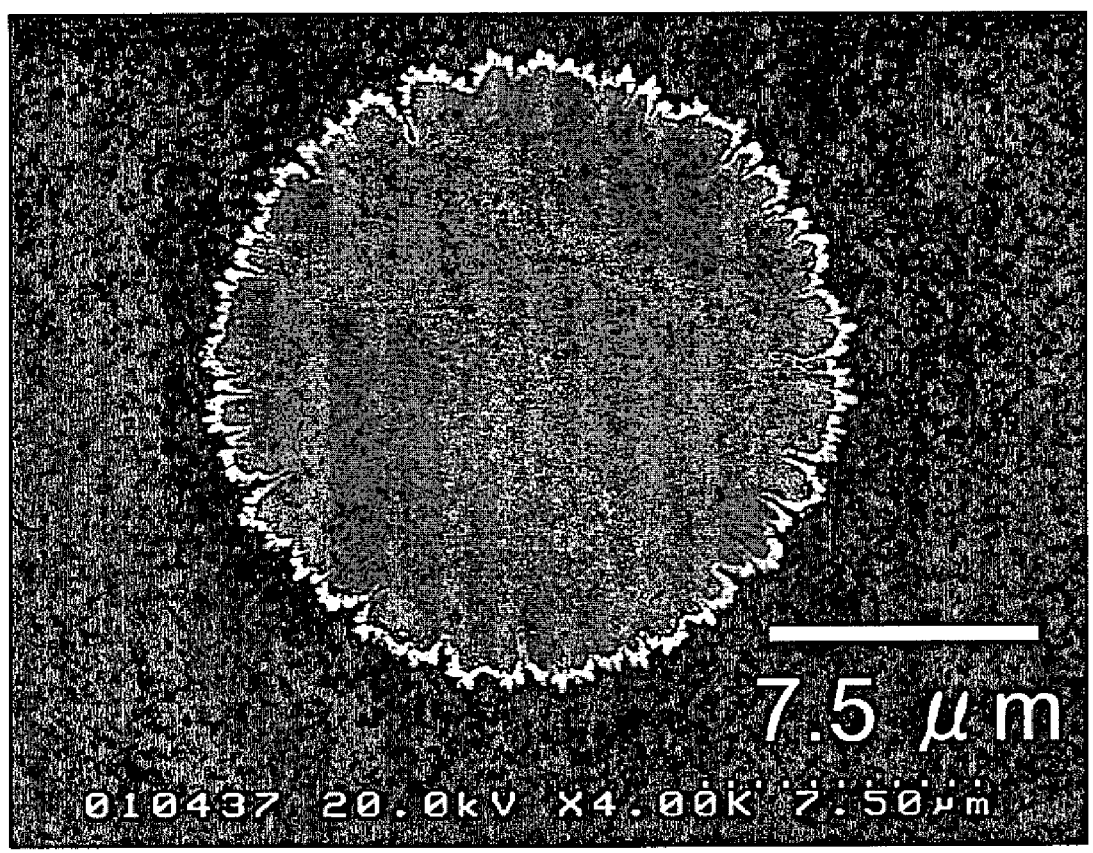
FIG. 22 is an SEM photo of the part which was loaded with silver particles.

By the use of the photolithographic technique, resist (acid-resistant resist having a thickness of 1.2 µm) patterns having regularly aligned circular openings with a diameter of 20 µm were formed on a substrate, which was the same as the one used in Example 25. The patterned substrate was washed with ultra-pure water for three minutes, soaked in 1% hydrofluoric acid for one minute to remove natural oxide, and washed with ultra-pure water for three minutes. Next, by soaking in the plating solution for ten seconds, silver was deposited on the silicon surface through the openings of the resist. After being washed with ultra-pure water for two minutes, with ethanol for three minutes, and with pentane for three minutes, the surface was naturally dried. An observation of the surface with SEM showed that, silver particles were deposited in accordance with the resist patterns, as shown in FIG. 21. Additionally, a magnified image of silver particles showed that they were secondary particles made of assembled primary particles, as shown in FIG. 22.

Figure 23:
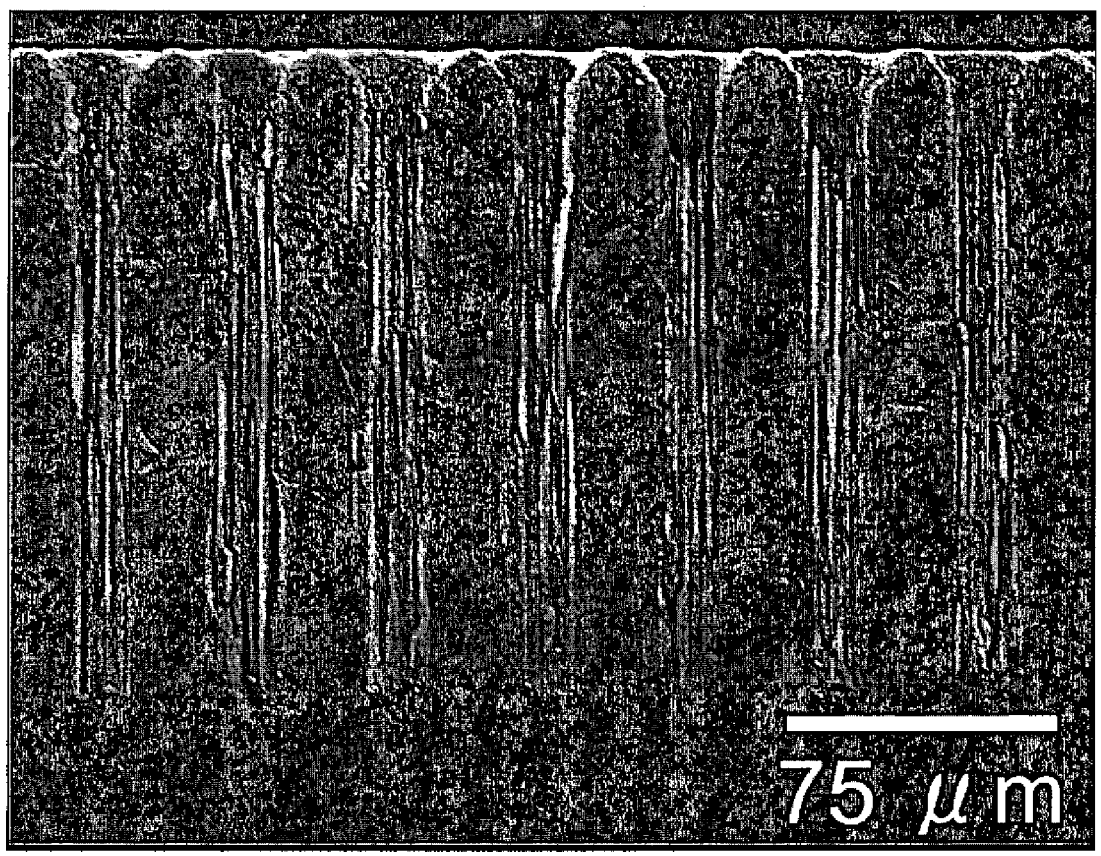
FIG. 23 is an SEM photo which shows a cross section of substrate in the thickness direction after the chemical etching.
Figure 24:
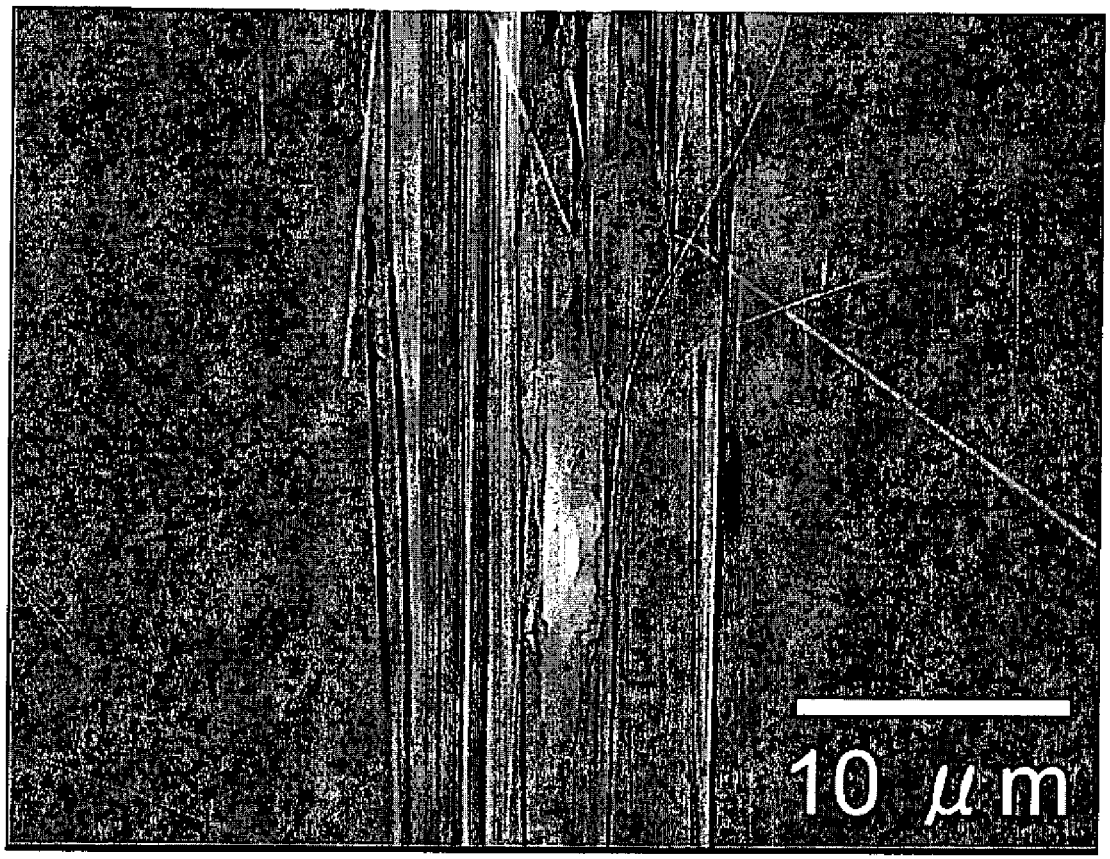
FIG. 24 is an SEM photo showing the middle point of a pore in the substrate.

The patterned substrate with silver deposits was soaked in the etchant for 217 minutes. Then, the substrate was washed with ultra-pure water for two minutes, with ethanol for three minutes, and with pentane for three minutes, and was naturally dried. The substrate was cut and its cross section was observed. As shown in FIG. 23, pores were formed in the direction vertical to the substrate plane in accordance with the silver pattern, and the depth was up to about 180 µm. A magnified image (FIG. 24) showed that the pores were made of many straight micropores. This shows that the location of pore can be controlled by controlling the location of silver deposits by photolithography and that larger pores can be obtained by depositing metal particles at high density.

The invention claimed is:
1. A monocrystalline substrate comprising:
pores formed in a <100> direction; and
silver particles existing at a bottom of the pores, the ratio of the pore diameter to the particle diameter being 1 to 2.
2. The monocrystalline substrate according to claim 1, wherein the substrate contains silicon in main proportions.
3. The monocrystalline substrate according to claim 1, wherein the pores have a diameter of 100 nm or less and an aspect ratio of 300 or more.
4. A mono- or multi-crystalline substrate comprising:
spiral pores with a pore diameter of 10 to 200 nm and a spiral diameter of 100 to 600 nm; and
one or more types of metallic particles selected from silver, platinum and palladium existing at the bottom of pores.
5. The crystalline substrate according to claim 4, wherein the substrate contains silicon in main proportions.

* * * * *